United States Patent
Dettmann et al.

(10) Patent No.: US 7,393,613 B2
(45) Date of Patent: **\*Jul. 1, 2008**

(54) SET OF AT LEAST TWO MASKS FOR THE PROJECTION OF STRUCTURE PATTERNS

(75) Inventors: Wolfgang Dettmann, München (DE); Jörg Thiele, München (DE); Rainer Pforr, Weixdorf (DE); Mario Hennig, Dresden (DE); Karsten Zeiler, München (DE)

(73) Assignee: Infineon Technologies AG, Neubiberg (DE)

( * ) Notice: Subject to any disclaimer, the term of this patent is extended or adjusted under 35 U.S.C. 154(b) by 395 days.

This patent is subject to a terminal disclaimer.

(21) Appl. No.: 10/791,763

(22) Filed: Mar. 4, 2004

(65) Prior Publication Data

US 2004/0202943 A1    Oct. 14, 2004

(30) Foreign Application Priority Data

Mar. 7, 2003    (DE) .............................. 103 10 137

(51) Int. Cl.
*G03F 1/00*    (2006.01)
*G03F 1/14*    (2006.01)

(52) U.S. Cl. .......................................... 430/5
(58) Field of Classification Search ................ 430/5
See application file for complete search history.

(56) References Cited

U.S. PATENT DOCUMENTS

| | | | |
|---|---|---|---|
| 6,558,853 B1 * | 5/2003 | Kawamura | 430/5 |
| 6,680,151 B2 | 1/2004 | Heissmeier et al. | |
| 6,730,463 B2 | 5/2004 | Heissmeier et al. | |
| 6,794,095 B2 | 9/2004 | Knobloch | |
| 6,807,662 B2 * | 10/2004 | Toublan et al. | 430/5 |
| 2004/0053141 A1 * | 3/2004 | Pierrat | 430/5 |
| 2004/0197677 A1 * | 10/2004 | Kohle et al. | 430/5 |

FOREIGN PATENT DOCUMENTS

DE        100 06 952 C2    5/2002

* cited by examiner

*Primary Examiner*—Mark F. Huff
*Assistant Examiner*—John Ruggles
(74) *Attorney, Agent, or Firm*—Edell, Shapiro & Finnan, LLC

(57) ABSTRACT

A set of at least two masks, coordinated with one another, for the projection of structure patterns, into the same photosensitive layer arranged on a semiconductor wafer. The first mask includes a semitransparent or nontransparent first layer, which is arranged on a first substrate and in which at least one first opening is formed at a first position, the first opening having a first lateral dimension, which is greater than the resolution limit of a projection system for the projection of the structure patterns. The second mask includes a semitransparent or nontransparent second layer, which is arranged on a second substrate and in which at least one dummy structure assigned to the first opening is formed at a second position, the dummy structure having a second lateral dimension, which is smaller than the resolution limit of the projection system wherein the first position on the first mask corresponds to the second position on the second mask.

5 Claims, 5 Drawing Sheets

SET OF AT LEAST TWO MASKS FOR THE PROJECTION OF STRUCTURE PATTERNS

CROSS REFERENCE TO RELATED APPLICATIONS

This application claims priority under 35 USC §119 to German Application No. 10310137.3, filed on Mar. 7, 2003, and titled "Set Of At Least Two Masks For The Projection of Structure Patterns, In Each Case Formed on the Masks and Coordinated With One Another, and Method for Producing the Masks," the entire contents of which are hereby incorporated by reference.

FIELD OF THE INVENTION

The invention relates to a set of at least two masks for the projection of structure patterns by a projection system into the same photosensitive layer arranged on a semiconductor wafer, and in particular, to alternating or chromeless phase masks assigned, as primary masks, secondary trimming masks for the purpose of avoiding phase conflicts and a method for producing the masks.

BACKGROUND

In the field of semiconductor technology, integrated circuits are usually produced by progressive projection of structure patterns, formed on masks, onto a semiconductor wafer coated with a photosensitive resist and a subsequent transferring of the structure pattern into layers respectively arranged underneath the resist. In order to further advance the miniaturization of structure sizes within the structure patterns in semiconductor technology, so-called resolution enhancement techniques (RET) are increasingly being resorted to for the projection. These involve, in addition to illumination methods such as off-axis illumination or structure-specific methods such as optical proximity correction (OPC), primarily innovative mask techniques such as phase masks, for example.

With regard to the resolution that can be achieved on a semiconductor wafer by an exposure device in a projection, the best results are obtained specifically by the type of alternating or chromeless phase masks. Alternating phase masks are particularly suitable for the projection of a dense line-gap pattern formed on such a mask type and having a width ratio of lines to gaps of about 1:1.

However, phase conflicts may occur in the case of the aforementioned types of phase masks. In the case of an exposure, the phase conflicts lead to undesirable, still unexposed resist structures in a photosensitive layer arranged on the semiconductor wafer. With the aid of a second or trimming exposure, the resist structures may subsequently be exposed and removed in a downstream development process.

Trimming masks are known which have light-transmissive openings within a nontransparent chrome layer on a substrate, which openings can be projected onto the resist structures of an alternating or chromeless phase mask which have already been produced by phase conflicts. With the aid of further openings in the chrome layer, it is possible, moreover, to expose further structure elements of a structure pattern having dimensions that are not so small and are thus not critical in the photosensitive layer. In this way, with the aid of a set of two masks with structure patterns coordinated with one another, it is possible to image extremely small dimension-critical structure elements besides larger and therefore less critical structure elements.

Trimming masks are typically formed as dark field masks, i.e., the structure elements to be formed on a wafer are formed as openings in a nontransparent or at least semitransparent layer on the substrate of the mask. The trimming masks are also referred to as secondary masks. Alternating phase masks are generally likewise present as dark field masks.

With the use of the phase masks of the alternating or chromeless type, a comparatively large lithographic process window can be obtained for many structure geometries, for example, of line-gap patterns. A lithographic process window represents the ranges of values of exposure dose and focus which are necessary in the event of a projection onto a wafer for not exceeding a specific structure width tolerance.

However, there are specific structure geometries for this mask type, in particular, line-gap patterns having a very special line-to-width ratio that differs from 1:1, for which, in particular, only a small process window can be obtained even using alternating or chromeless phase masks. In particular, a depth of focus that is too small for application in circuit fabrication is achieved in this case. It is usually the case that such structure patterns cannot be imaged with sufficient quality even by a second exposure with the aid of a trimming mask.

One albeit inadequate solution to the existing problem consists in excluding, as early as during the preparation for the purpose of forming the structure pattern on the mask, those widths of individual structure elements or periods of regular patterns for which only a very small process window may be expected for the structure element, for example, on account of experimental or simulator-based investigations. In order nevertheless to be able to realize the desired structure patterns with their functionality in the later completed integrated circuit, it is thus necessary to create designs which satisfy the exclusion criteria mentioned.

This leads to an increased complexity at least in the design of the component. There may also be limitations in the functionality made possible by the layout. This often also results in an enlargement of the circuit area, which may also result in higher costs for fabrication due to the smaller number of circuits per wafer.

SUMMARY

Improving the quality of the projection of structure patterns, formed on masks, onto a semiconductor wafer and reducing the costs for the production of integrated circuits is desirable. In particular, improving the process of double exposure of masks, in particular, using an alternating or chromeless phase mask and a trimming mask assigned to the mask such that line-gap patterns with very different structure geometries can be projected onto a wafer with an enlarged process window in comparison with the prior art is desired.

A set of at least two masks for the projection of structure patterns can include a first mask and a second mask. The first mask has a semitransparent or nontransparent first layer, which is arranged on a first substrate and in which at least one first opening is formed at a first position, the first opening can have a first lateral dimension, which is greater than the resolution limit. The second mask is assigned to the first mask. The second mask includes a semitransparent or nontransparent second layer, which is arranged on a second substrate and in which at least one first dummy structure assigned to the first opening is formed at a second position. The first dummy structure can have a second lateral dimension, which is smaller than the resolution limit. The first position on the first mask can be identical to the second position on the second mask.

The projection system can have a resolution limit for a lateral dimension of an opening projected onto the semiconductor wafer from a mask. The structure patterns can each be formed on the masks and coordinated with one another by a projection system into the same photosensitive layer arranged on a semiconductor wafer.

A method for producing the set is also desirable.

On the trimming mask provided for a second exposure in a trimming exposure process, which may be, a dark field mask, further openings as bright structures in dark surroundings can be positioned. These further openings have a lateral dimension which is smaller than the resolution limit of the projection system and are therefore referred to as dummy structures. The openings established for the postexposure of still unexposed regions in the photosensitive layer and the openings established for transferring relatively large active structures to a wafer.

Accordingly, at least one opening that cannot be resolved by the projection system is provided on the second mask. Such a structure is also referred to as a sub-resolution structure, but the latter, according to the invention, does not serve as an auxiliary structure of a master structure arranged on the same mask. Rather, the dummy structure is positioned on the second mask at precisely that position where it falls, by virtue of its imaging during a projection onto the segment already irradiated in the primary exposure through the first opening of the first mask, in the image plane of the projection system, i.e., into the photosensitive layer on the wafer. The second mask thus gives rise to a postexposure of the latent image of one or more structures in the resist, the latent image already existing as a result of the first exposure.

The dummy structure is formed, in particular, as a dummy opening and has the property that, during an exposure of the photosensitive layer, it is through the second mask that a resist structure is not formed on account of the projection of the dummy structure, since it has a lateral dimension below the resolution limit of the projection system.

With the aid of the combination of a structure-forming opening at a position on the first mask and a dummy structure formed at the same relative position on the second mask, it is possible to achieve an improvement in the lithographic process window, in particular, in the depth of focus during the projection of the relevant structure elements or openings onto a wafer.

A plurality of openings separated by webs in a periodic arrangement on the first mask, in each case, can be supplemented by dummy structures, according to the invention, on the second mask assigned to the first mask. In this case, too, the positions of the openings and dummy structures assigned thereto can be, in each case, identical.

In this case, "identical" means that the positions are identical relative to a system of coordinates of the mask which can be transferred from the first mask to the second mask. This is the case, for example, if the masks have essentially identical external dimensions and their positioning in a mask mount during a projection is defined by markings in the substrate. Consequently, the imaging of the opening and of the dummy structure assigned thereto also fall into the same segment on the image plane, i.e., the photosensitive layer.

The openings separated periodically by webs, for example, chrome webs, form a line-gap pattern having a ratio of line width to gap width. The process windows that are relatively small for very special values of this ratio during a projection according to the prior art are considerably enlarged on account of the assigned dummy structures. Therefore, it is no longer necessary to exclude specific structure geometries in the layout of an integrated circuit or the number of structure geometries to be excluded can be reduced.

Since, for this configuration according to the invention, the openings or gaps on the first mask are allocated dummy structures or dummy gaps having a relatively small lateral dimension, an assigned line-gap pattern having a particularly large ratio of line width to gap width (web width to opening width) results on the second mask.

A method for producing the mask set provides for the checking of conditions under which it is necessary to select those openings which are to be assigned a dummy structure on a second mask in order to improve or enlarge the process window. In an iterative process, the dummy structures can then be adapted in terms of their form, for instance, in terms of their lateral dimension, such that a process window that is relatively large or as large as possible is obtained.

For this purpose, use is made of a simulation method including conventional lithography simulation programs. By calculating the Bossung curves of the opening to be imaged, the formation of the shape of this curve $$CD = CD \text{ (defocus)}$$

is determined. In this case, CD denotes the lateral dimension or line width of the resist structure which is formed as an image of an opening of the first mask on the wafer and arises after development in the photosensitive layer. The term, "defocus" denotes the difference between the current image plane and the optimum image plane.

The shape of the Bossung curve is generally established symmetrically about an axis in the diagram that is represented by the optimum focus. It may also assume a concave or a convex shape. The term concave denotes that curve shape in the case of which the line width increases as the defocus increases.

Only the adjacent gaps of those resist structures whose Bossung curve has a concave profile receive a dummy exposure. The width of the dummy structures or dummy gaps used for the dummy exposure on the second mask is less than that of the corresponding openings or gaps on the primary mask. The iterative simulator-based method determines the structure geometry of the gaps used for the dummy exposure, the influence of the structure geometry on the shape of the Bossung curves being investigated and that structure geometry of the dummy gap being selected for which the Bossung curve runs approximately parallel to the focus axis. This flat shape of the Bossung curve enables a greater depth of field for the projection for a prescribed structure width tolerance.

By contrast, a dummy exposure given the presence of a convex shape of the Bossung curve would reduce the depth of field range. Thus, if a convex shape is ascertained when performing the method according to the invention, i.e., the upper limit value of the tolerance interval is not exceeded by measured values obtained from the simulation, then the iteration is ended. No dummy structure is then formed on the trimming mask.

A classification of the dummy gap geometry into a few basic values is also provided within the scope of the invention. Restriction to a basic width is effected in the limiting case.

In the case of phase masks and the trimming masks assigned thereto, an inverse assignment to the primary mask instead of the secondary mask with regard to dummy structures is also provided within the scope of the invention. That is, on the primary mask, besides the openings provided for a projection, dummy structures according to the invention are introduced for improving the process window of the openings transferred through the second exposure with the trimming mask. In this case, the trimming mask is the "first" mask and the primary mask of the trimming exposure is the "second" mask, the terms "first" and "second" not explicitly being meant to be a temporal reference or such a reference of the order during the exposure.

Various mask types are provided as the primary mask, such as, for example, alternating or chromeless phase masks, tritone phase masks or chrome masks and mixed forms including these mask types. A chrome mask or a tritone phase mask is typically used as the secondary or trimming mask. However, alternating or chromeless phase masks or mixed forms thereof are likewise provided within the scope of the invention.

The core of the invention is the reciprocal, i.e., from a primary mask into a secondary mask and vice versa, dummy trimming into already imaged openings or gaps in order to enlarge the lithographic process window during the formation of resist webs and also a method for selection of the relevant structure geometry.

The dummy exposure provided according to the invention by a dummy structure formed on a second mask can enlarge the process window of the relevant resist structure, in particular, the depth of focus thereof. Structures with geometries for which single exposure does not make it possible to obtain a sufficient depth of focus for application in fabrication are improved by the dummy exposure. This applies to those structures which form a curve having a concave profile after the primary imaging over the defocus. The improvement in the process window by the dummy exposure method according to the invention makes it possible to reduce or eliminate restrictions in the realization of special previously imaging-critical structure geometries during design creation and thus to reduce the size of the circuits. Since improvements can furthermore also be achieved for structures with a semicritical process window, the line width variation and thus the rework rate for the lithographic process are reduced, and, consequently, the product yield of the circuits produced is increased.

A further aspect of the invention provides for at least one relatively opaque structure element to be formed at a further first position on the first mask, so that, by its image in the case of a projection onto the semiconductor wafer, a still unexposed resist region is formed in the photosensitive layer, and for at least one semitransparent region to be arranged at a further second position on the second mask. The further second position corresponds to the further first position on the first mask such that, by its image in the case of a projection on the semiconductor wafer, at least part of the resist region can be exposed in the photosensitive layer.

The combination of a transparent structure element on the first mask with a dummy structure on the second mask, which has a lateral dimension below the resolution limit of the projection system for prescribed exposure parameters, can be supplemented by the combination of a transparent region on the first mask with a semitransparent region on the second mask. As a result, different transparent structure elements on a mask with an improved process window with the aid of a second mask assigned to the first mask can be imaged.

BRIEF DESCRIPTION OF THE DRAWINGS

The invention will now be explained in more detail using exemplary embodiments with the aid of a drawing, in which.

DETAILED DESCRIPTION

Figure 1:
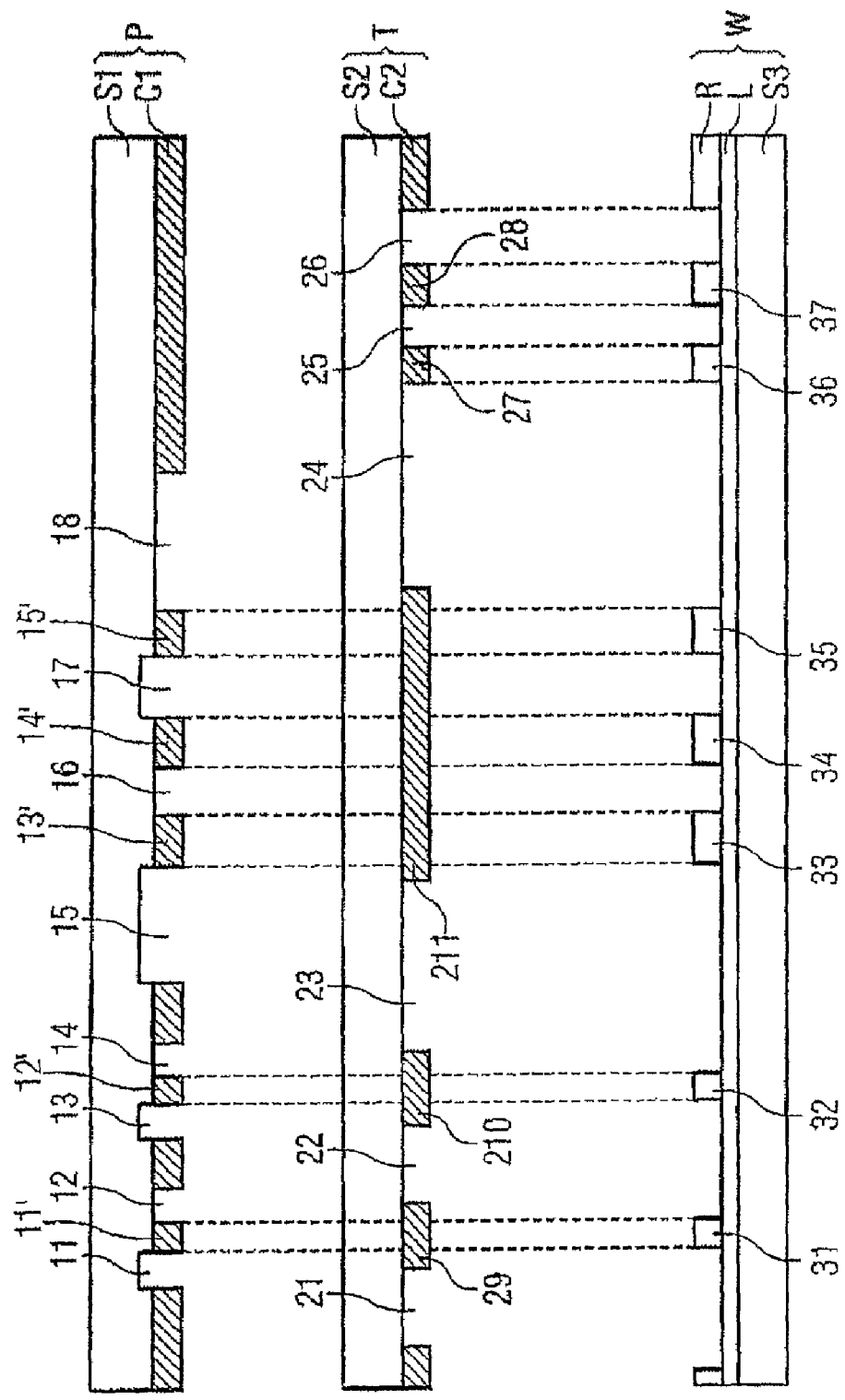
FIG. 1 shows a cross section through a primary mask provided for a projection onto a wafer and a trimming mask assigned to the primary mask in accordance with the prior art.

FIG. 1 uses the example of an alternating phase mask P, which is imaged sequentially in combination with a trimming mask T onto the substrate W, to show the typical method of double exposure, i.e., the combination of first and second exposure, in accordance with the prior art. In this document, the term trimming mask exposure process denotes a method in which the exposure with a primary mask and a secondary mask, the trimming mask, onto a wafer is carried out successively without the resist arranged on the wafer being developed in the meantime.

The alternating phase mask P can have gaps 11 to 18 and webs 11', 12' and 13' to 15', which are formed in a chrome layer C1 on a substrate S1, for example, made of quartz. Of the gaps 11 to 18, the gaps 11, 13, 15, 17 can be etched deep into the substrate S1, so that light passing through the gaps has a phase deviation of 180° with respect to a light passing through the gaps 12, 14, 16. The gaps 15 to 18 represent a dense line-gap pattern.

The trimming mask T can be configured as a conventional chrome mask. Gaps 21 to 26 and webs 27 to 29, 210 to 211 can be arranged in a chrome layer C2 arranged on a further substrate S2.

The trimming mask T is illustrated below the alternating phase mask P in FIG. 1 only for the purpose of comparing the mode of operation. The exposures can be performed at identical positions in an exposure device. Broken lines emphasize comparable positions on both masks in the horizontal X direction, i.e., the mask or wafer plane, the generally demagnifying projection from a mask onto a semiconductor wafer W not being taken into consideration in the diagrammatic illustration, for simplification purposes. Details of the imaging system such as the illumination source or lenses have also been dispensed with in FIG. 1.

FIG. 1 illustrates at the bottom the wafer W with the resist R to be exposed, which, for example, is arranged on a layer L made of electrically insulating or conductive material and a substrate S3 made of monocrystalline silicon.

The resist R can have the unexposed regions 31 to 37 resulting from a progressive double exposure with the alternating mask P (primary mask) and the trimming mask T in the resist layer after a development process has been carried out. In the example, a positive resist was used as resist R. By the trimming mask T, the gaps 21 to 23 can be imaged as bright regions on the wafer W, the opaque webs 29, 210, 211 being used to protect the aerial images or images of the webs 11' to 15', i.e., the resist webs 31 to 35, from a second irradiation. The images of the further chrome webs, i.e., those without reference symbols, can be arranged between the chrome webs provided with reference symbols in FIG. 1 can be, by contrast, postexposed on the wafer by the trimming mask T and therefore can disappear after development.

By the gaps 24 to 26, a region in the resist R which is not exposed by the imaging of the mask P alone can be exposed in order to form the resist webs 36 and 37. Consequently, the trimming mask T, which itself usually does not achieve the high resolution of the first mask P, can also be used to actively produce structure elements on the wafer.

Figure 2:
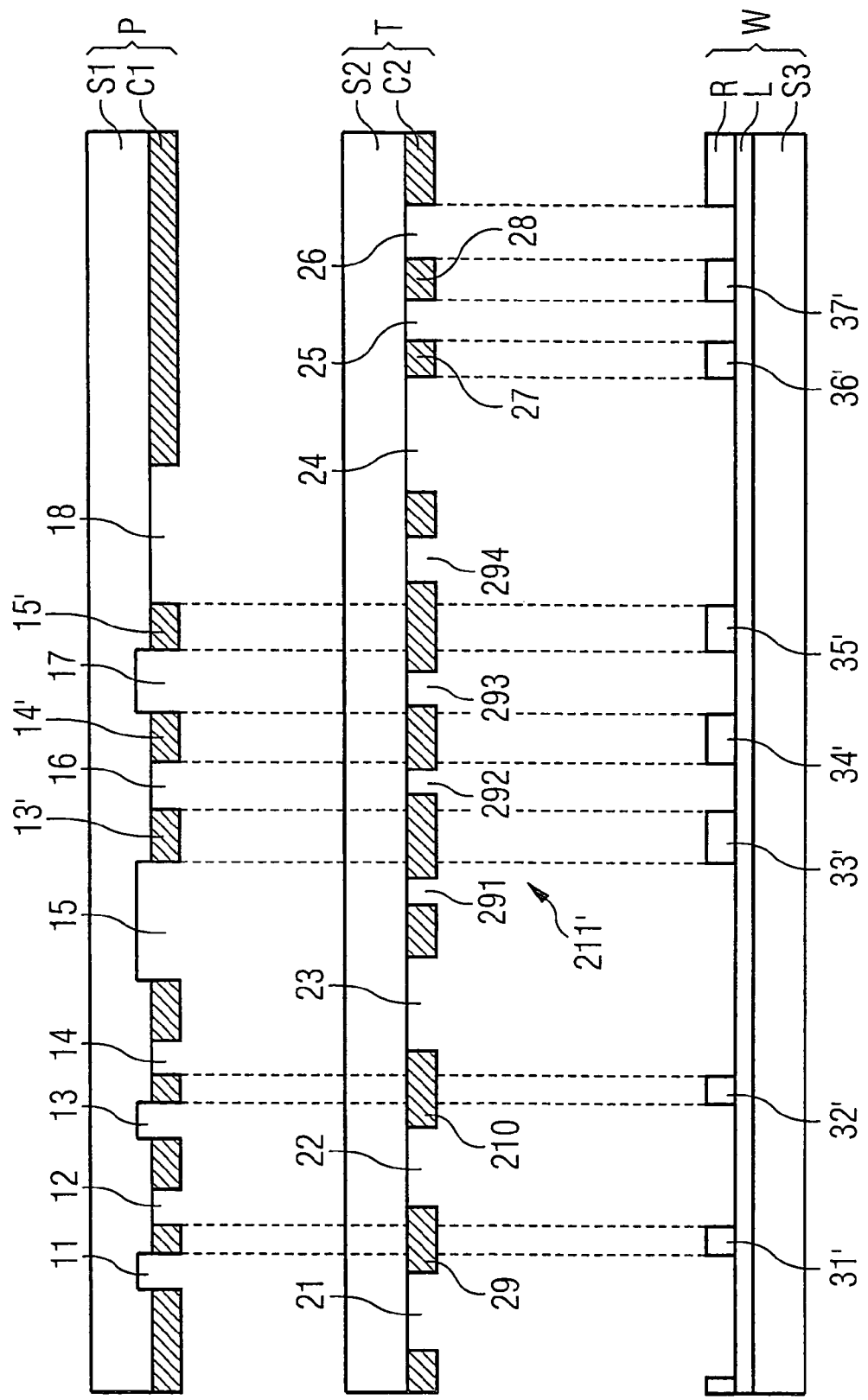
FIG. 2 shows a cross section through a primary mask provided for a projection onto a wafer and a trimming mask assigned to the primary mask as FIG. 1, but in accordance with a first exemplary embodiment of the invention.

FIG. 2 shows a first exemplary embodiment according to the present invention. An alternating phase mask P can be formed analogously to the alternating phase mask illustrated in FIG. 1. In the trimming mask, a group of gaps 291 to 294 and webs 211' can be introduced in the region of the previous chrome pad 211. The gaps 291-294 on the trimming mask can be positioned such that their image on the wafer W falls in centered fashion onto the relevant projected image of the corresponding phase-shifting gaps 15-17 of the primary phase mask. Moreover, the lateral dimension of the gaps 291 to 294 can be smaller than that of the corresponding phase-shifting openings situated on the phase mask. These gaps can be imaged into regions on the wafer which have already experienced an irradiation by the phase shifters.

In the example, the masks of the mask set can include a primary and secondary mask provided for an exposure at a wavelength of 193 nm and with a numerical aperture of 0.70. The resolution capability amounts to about 80 run. By contrast, the gaps 291 to 294 have a lateral dimension of 70 nm relative to the wafer scale, i.e., dummy gaps are involved.

Figure 3:
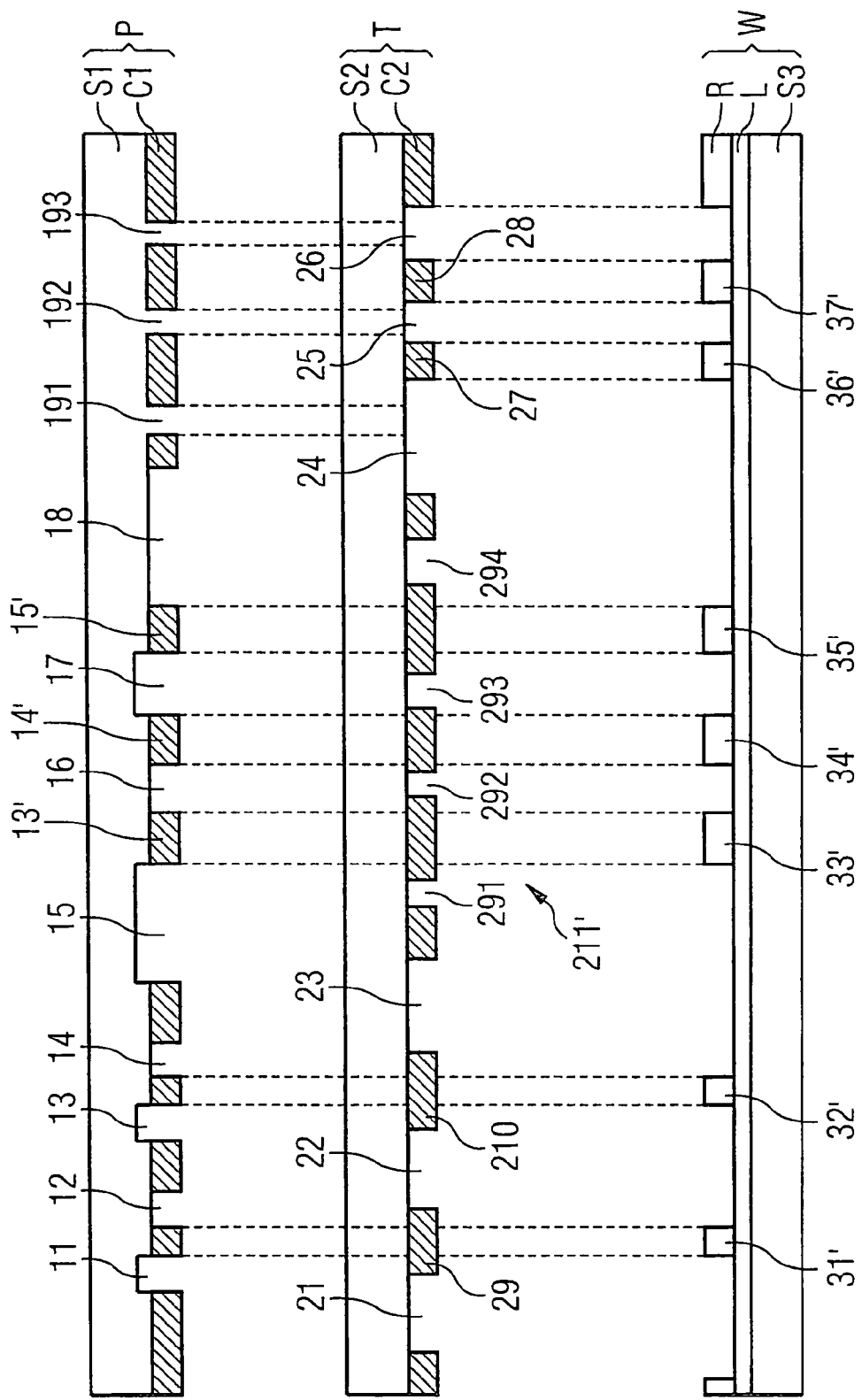
FIG. 3 shows a cross section through a primary mask provided for a projection onto a wafer and a trimming mask assigned to the primary mask as FIG. 2, but in accordance with a second exemplary embodiment of the invention.

FIG. 3 shows, in an extension of FIG. 2, dummy gaps 191 to 193 on the primary phase mask. With regard to the dummy structures or gaps 191 to 193, the "second" mask according to the invention is represented by the alternating phase mask P and, with regard to the dummy structures or gaps 291 to 294, the "second" mask according to the invention is represented by the trimming mask T. The dummy gaps 191-193 can produce an additional irradiation of the photosensitive layer R in the exposed segment of the images of the gaps 24 to 26 of the trimming mask. The dummy gaps 191 to 193 can be introduced centered with respect to the corresponding gaps 24 to 26 on the trimming mask and have smaller lateral dimensions than the gaps on the trimming mask. Their size can be determined according to the method described above for the trimming mask. The additional exposure with the trimming gaps can increase the depth of focus of the resist structures 36' and 37' produced by double exposure. For the reason already explained above for phase masks, dummy gaps on the phase mask can be used when the Bossung curves of the corresponding webs, in the case of an exclusive (single) exposure with the trimming mask, have a pronounced concave shape and thus lead to a small depth of focus.

Figure 4:
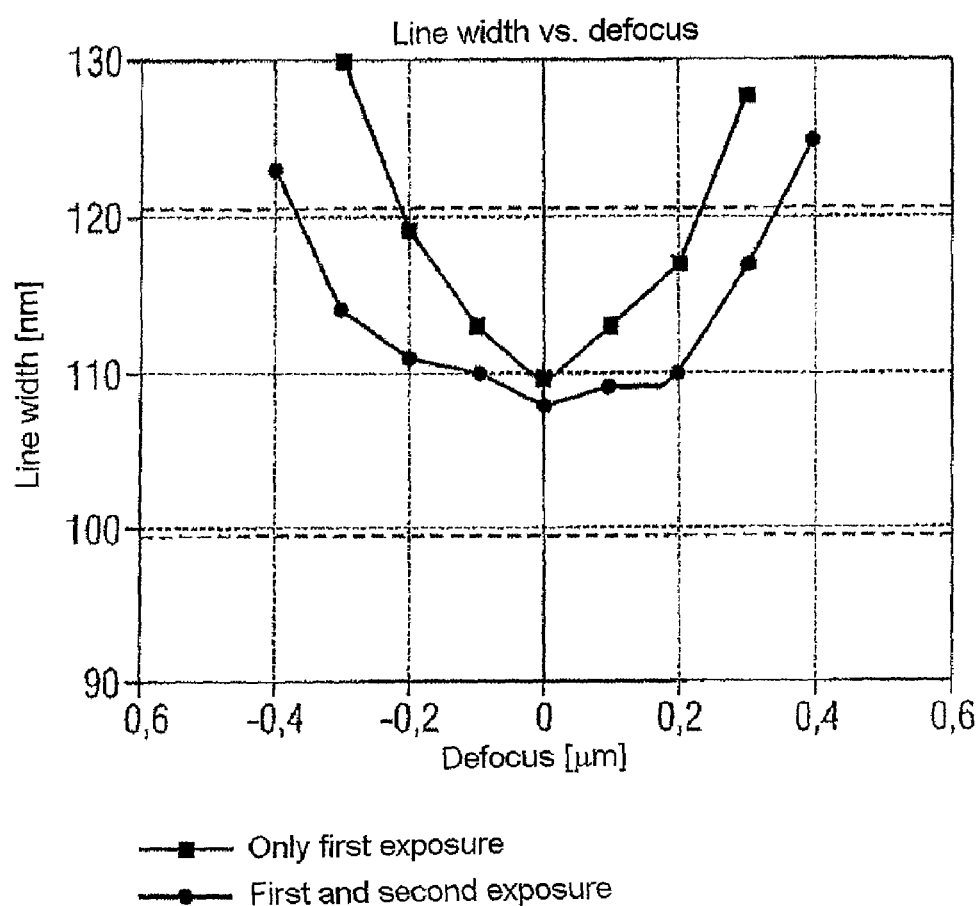
FIG. 4 shows a diagram with a Bossung curve in each case for the exemplary embodiment in accordance with the prior art and for the first exemplary embodiment of the invention.

The additional exposure with the dummy gaps can be carried out in order to alter the profile of the line width over the defocus CD=CD (defocus) to achieve an increase in the depth of focus. This is possible whenever the shape of the Bossung curve in the case of single exposure with the phase mask is concave (see FIG. 4). As a result of the exposure with the gaps of the trimming mask, concavely formed curves are stretched to a significant extent, which effectively means an increase in the depth of focus. FIG. 4 diagrammatically shows the curve profile CD=CD (defocus) before and after the exposure with the trimming mask. In the present example, the depth of focus can increase approximately by a factor of 1.5.

The line width achieved at the optimum focus can be a little smaller than can be corrected by a bias on the primary structure. The optimum size of the gaps depends on various factors, such as the numerical aperture NA of the objective (for both masks), the wavelength of the light used for imaging, the type of illumination, and also on the line and gap widths of the structures on the phase mask. Furthermore, the properties of the photoresist used are to be taken into account.

The invention can provide for the size of the trimming gaps 291 to 294 to be determined by a simulator-based method. The properties of the photoresist can also be incorporatd. In this case, the gap width on the trimming mask can be varied with incremental alteration until a Bossung curve is fashioned which runs parallel or almost parallel to the defocus axis. In practice, however, restriction can be effected to a few fixed values assigned to previously determined structure groups on the primary mask. In a maximum simplification, effecting restriction to a single suitable gap width can be provided. FIG. 4 shows the optimization method in a flow diagram. If the Bossung curve already has an approximately straight or convex shape after single exposure, no dummy gaps are introduced into the trimming mask.

Figure 5:
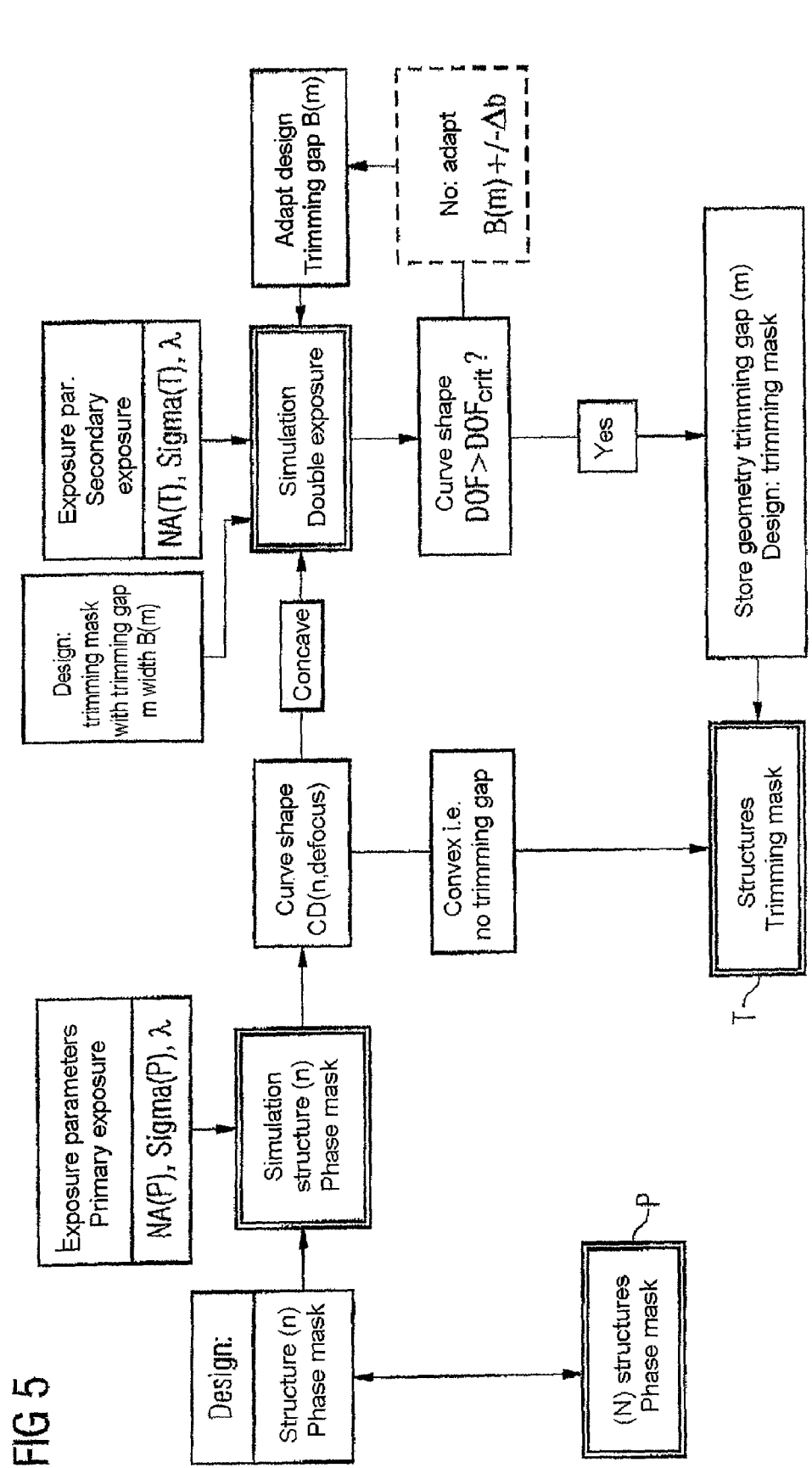
FIG. 5 shows a flow chart of an exemplary method according to the invention.

FIG. 5 shows a flow chart of an exemplary embodiment for the simulation method according to the invention. In a first step, the design of a primary mask, for example, here, a phase mask, is provided. A structure n can be formed on the phase mask or in the design, for which structure a dummy structure according to the invention or a trimming gap m is to be provided on a trimming mask assigned to the primary mask, which trimming mask is still to be produced.

With the aid of a conventional simulation program such as is known to the average person skilled in the art from the prior art, the aerial image arising at a wafer level from a projection with the primary mask can be calculated as imaging of the structure n. This calculation can also incorporates exposure parameters such as, for example, the numerical aperture, the exposure wavelength, or the factor σ of the projection system that is respectively to be used. The result of the simulation method according to the invention can also be, in particular, a configuration of the trimming gap m on the secondary mask where the configuration can be dependent on the projection system.

The simulation is repeated for a number of different focus settings, i.e., over a specific interval of the defocus. The line widths CD of the image of the structure n can be determined as a function of the defocus in each case from the aerial image. A first Bossung curve can be obtained in this way.

In a next step, the shape of the Bossung curve is determined. If the latter can be convex, then no trimming gap m is formed on the trimming mask at the position corresponding to that position of the structure n on the primary mask.

By contrast, if the curve has a concave shape, then a trimming gap m having a first gap width B(m) can be placed at the corresponding position in the design of the trimming mask on a trial basis.

Afterward, the aerial image arising on account of an additional second exposure with the trimming mask can be simulated by the trimming mask design established on a trial basis. The calculation can incorporate second exposure parameters, such as the numerical aperture, etc. that are changed, if appropriate, with respect to the first exposure parameters. The simulation can be repeated for the number of defocus values, thereby obtaining a second Bossung curve which is now based on a first and second exposure.

The step of curve analysis can be repeated. The depth of field range can be determined from the Bossung curve and compared with a prescribed limit value ($DOF_{Crit}$). If the depth of field range determined lies above the limit value, then it is possible to store the current trimming gap geometry in the design of the trimming mask.

By contrast, if the limit value is undershot, then the width of the trimming gap m can be adapted depending on the presence of a concave or convex shape of the Bossung curve, i.e., increased (in the case of a concave shape) or decreased (in the case of a convex shape). With the adapted width B(m) of the trimming gap m, the simulation of the aerial image and the evaluation thereof can be repeated in an iteration loop. The position of the trimming gap m can be kept constant in this case. The trimming gap m can lie centrally at a position on the trimming or secondary mask T, which corresponds to the position of the structure n on the primary mask P.

If the limit value is not exceeded, then the exposure parameters for the trimming exposure can be adapted in order subsequently carry out a renewed iteration for determining the trimming gap width.

A mask production process may subsequently be initiated using the stored designs or data representations in each case of the primary and secondary masks (the phase and trimming masks in the exemplary embodiment). The result is a mask set according to the invention with structure patterns coordinated with one another.

The data representation may be a GDSII file, for example. However, any other data format which is familiar to the practiced person skilled in the art and in which the design or layout of the structures on a mask can be stored electronically is also conceivable.

One aspect of the method according to the invention provides for a line width adaptation of the opening on the first mask to be carried out in a manner dependent on the precise value of the adaptation of the transparency. By changing the process window, the imaging properties of the openings formed on the first mask may also change.

Prescribing a further opening in the second data representation of the second mask (T) and for assigning to it a further semitransparent region in the first data representation of the first mask (P) is also possible. Steps d) to l) of the method according to the invention may then be repeated in order to adapt a transparency of the further semitransparent region on the first mask. Consequently, semitransparent regions according to the invention can be patterned on both masks, which regions improve the process window of the imaging of openings respectively formed on the other mask.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

| | |
|---|---|
| C1 | Opaque layer of the first mask |
| C2 | Opaque layer of the second mask |
| L | Layer |
| P | First mask, primary mask |
| R | Photosensitive layer |
| S1 | Substrate of the first mask |
| S2 | Substrate of the second mask |
| S3 | Substrate of the semiconductor wafer |
| T | Second mask, secondary mask, trimming mask |
| W | Semiconductor wafer |
| 11-18 | Openings on first mask |
| 11'-15' | Opaque webs on first mask |
| 21-26 | Openings on second mask |
| 27-29, 210, 211 | Opaque webs on second mask |
| 31-37 | Unexposed resist structures in the photosensitive resist |
| 191, 192, 193 | Dummy structures |
| 291-294 | Dummy structures |

We claim:

1. A set of at least two masks for the projection of structure patterns, each structure pattern being formed on the masks and coordinated with one another by a projection system into the same photosensitive layer arranged on a semiconductor wafer, the projection system having a resolution limit for a lateral dimension of an opening projected onto the semiconductor wafer from a mask, comprising:
a first mask including a semitransparent or nontransparent first layer, which is arranged on a first substrate and in which at least one first opening is formed at a first position, the first opening having a first lateral dimension, which is greater than the resolution limit; and
a second mask assigned to the first mask, the second mask including a semitransparent or nontransparent second layer, which is arranged on a second substrate and in which at least one dummy structure assigned to the first opening is formed at a second position, the dummy structure having a second lateral dimension, which is smaller than the resolution limit of the projection system wherein the first position on the first mask identically corresponds to the second position on the second mask,
wherein one of the first and second masks is an alternating phase mask,
wherein the other of the first and second masks is a trimming mask having at least one further opening for the exposure of a region in the photosensitive layer, which arises on account of a phase conflict in the case of an exposure with said one of the first and second masks, and
wherein the second lateral dimension is selected to improve a depth of focus in a combined double exposure by the first and second masks.

2. The set of masks as claimed in claim 1, wherein the first opening, a second opening, and at least one third opening are arranged as gaps in a periodic line-gap pattern on the first mask.

3. The set of masks as claimed in claim 2, wherein the first opening, the second opening, and the at least one third opening, as gaps, are separated from one another by first, second and third webs formed by the semitransparent or nontransparent first layer, the first opening, the second opening, and the at least one third opening in each case have the same first lateral dimension, the first, second and third webs in each case have identical third lateral dimensions, but the first and the third lateral dimensions are different from one another.

4. The set of masks as claimed in claim 3, wherein the first opening, the second opening, and the at least one third opening are in each case assigned a dummy structure, the position of the first opening, the second opening and the at least one third opening on the first mask each corresponding identically to that position of the dummy structure assigned thereto on the second mask.

5. The set of masks as claimed in claim 1, wherein at least one further transparent opening is formed at a further first position on the first mask, and at least one semitransparent region is arranged at a further second position on the second mask, the further second position corresponding to the further first position on the first mask.

* * * * *

UNITED STATES PATENT AND TRADEMARK OFFICE
CERTIFICATE OF CORRECTION

PATENT NO. : 7,393,613 B2 Page 1 of 1
APPLICATION NO. : 10/791763
DATED : July 1, 2008
INVENTOR(S) : Wolfgang Dettmann et al.

It is certified that error appears in the above-identified patent and that said Letters Patent is hereby corrected as shown below:

Column 7, line 26: replace "80 run" with -- 80 nm --.

Signed and Sealed this

Twenty-first Day of October, 2008

JON W. DUDAS
*Director of the United States Patent and Trademark Office*